United States Patent [19]

Adam et al.

[11] 3,983,408
[45] Sept. 28, 1976

[54] BUCKET-BRIGADE CIRCUIT
[75] Inventors: Fritz Gunter Adam, Freiburg; Klaus Wilmsmeyer, Denzlingen, both of Germany
[73] Assignee: ITT Industries, Inc., New York, N.Y.
[22] Filed: Apr. 5, 1974
[21] Appl. No.: 458,153

[30] Foreign Application Priority Data
Apr. 6, 1973 Germany.............................. 2317251
July 14, 1973 Germany.............................. 2335988

[52] U.S. Cl. ............................ 307/221 D; 307/264; 328/162; 328/172; 357/24
[51] Int. Cl.² ................... G11C 19/28; H03K 23/02
[58] Field of Search............ 307/221 C, 221 D, 264; 357/24; 328/162–163, 172–175

[56] References Cited
UNITED STATES PATENTS
3,809,923 5/1974 Esser............................... 307/221 D

OTHER PUBLICATIONS

IBM Technical Disclosure Bulletin, vol. 16, No. 10, Mar. 1974, pp. 3164–3165, "Charge Transfer Compensation Circuit," by L. G. Heller et al.

*Primary Examiner*—John Zazworsky
*Attorney, Agent, or Firm*—John T. O'Halloran; Peter Van Der Sluys; Vincent Ingrassia

[57] ABSTRACT

This invention relates to a bucket brigade circuit or delay line wherein there is provided frequency-dependent compensation of the signal attenuation after n-stages of the circuit. The compensation circuit contains a differential amplifier and a transferring circuit adding the frequency dependent signal loss to the bucket brigade line signal. The differential amplifier samples the signal of two adjacent stages controlled by the same clock signal phase.

23 Claims, 10 Drawing Figures

BUCKET-BRIGADE CIRCUIT

BACKGROUND OF THE INVENTION

This invention relates to bucket-brigade circuit of the type known from the article published on pages 131 to 136 in the "IEEE Journal of Solid-State Circuits" for June 1969. Such bucket-brigade circuits comprise a plurality of stages which are all of the same kind, and each of which consists of a transistor and a capacitor arranged between the gate and the drain terminal thereof, and which are in such a way connected in series that the drain terminal of one transistor is connected to the source terminal of the next transistor. The gate terminals of the even-numbered transistors are controlled by a first square-wave clock signal, and the gate terminals of the odd-numbered transistors are controlled by a second square-wave and equal-frequency clock signal whose effective pulses fall within the intervals of the effective pulses of the first clock signal. Such bucket-brigade circuits are also referred to as shift registers or delay lines for analog signals.

The problem inherent in such bucket-brigade circuits has been described, for example, in the article published on pages 941 to 950 in the "IEEE Transactions on Electron Devices" for October 1971, and on pages 391 to 394 of the "IEEE Journal of Solid-State Circuits" for December 1971, and resides in the fact that the signal to be delayed is more and more attenuated as the frequency increases, reaching the greatest attenuation at the maximum delayable signal frequency which, according to the sampling theorem, is equal to half the frequency of the clock signals. The jump in potential appearing from stage to stage is the greatest at this particular frequency, while the potential jumps and consequently, the signal attenuation decrease as the signal frequency decreases. The frequency-dependence of the attenuation restricts the maximum utilizable number of stages of the bucket-brigade circuits and, consequently, also the maximum obtainable delay time.

From the first of the aforementioned publications so-called level regenerating circuits have become known which, however, only vary the d.c. level and/or amplify the signal to be delayed without preferentially raising the high frequency end thereof.

SUMMARY OF THE INVENTION

It is an object of the present invention to provide a bucket-brigade circuit wherein the high-frequency end of the signal band to be delayed is raised i.e. in which there is effected a frequency-dependent compensation of the aforementioned attenuation by means of an additional circuit. According to a broad aspect of the invention there is provided claim 1. A bucket-brigade circuit wherein there is provided a plurality of stages which are all of the same kind, each consisting of a transistor and a capacitor coupled between the gate and drain terminal thereof, and coupled together such that the drain terminal of each transistor is connected to the source terminal of the next successive transistor, wherein the gate terminals of even numbered transistors are controlled by a first squarewave clock signal and the gate terminals of odd numbered transistors are controlled by a second squarewave clock signal of the same frequency having effective pulses lying in the intervals between effective pulses of said first clock signal comprising a differential amplifier having first and second inputs, said first input coupled to the drain of a first transistor and said second input coupled to the drain terminal of a second transistor, said first and second transistors each contained in first and second alternate stages of said plurality of stages, said differential amplifier having first and second outputs, said first output coupled to the drain terminal of one of the transistors in said bucket-brigade circuit.

The above and other objects of the present invention will be better understood from the following detailed description taken in conjunction with the accompanying drawings in which:

DESCRIPTION OF THE PREFERRED EMBODIMENTS

Figure 1:
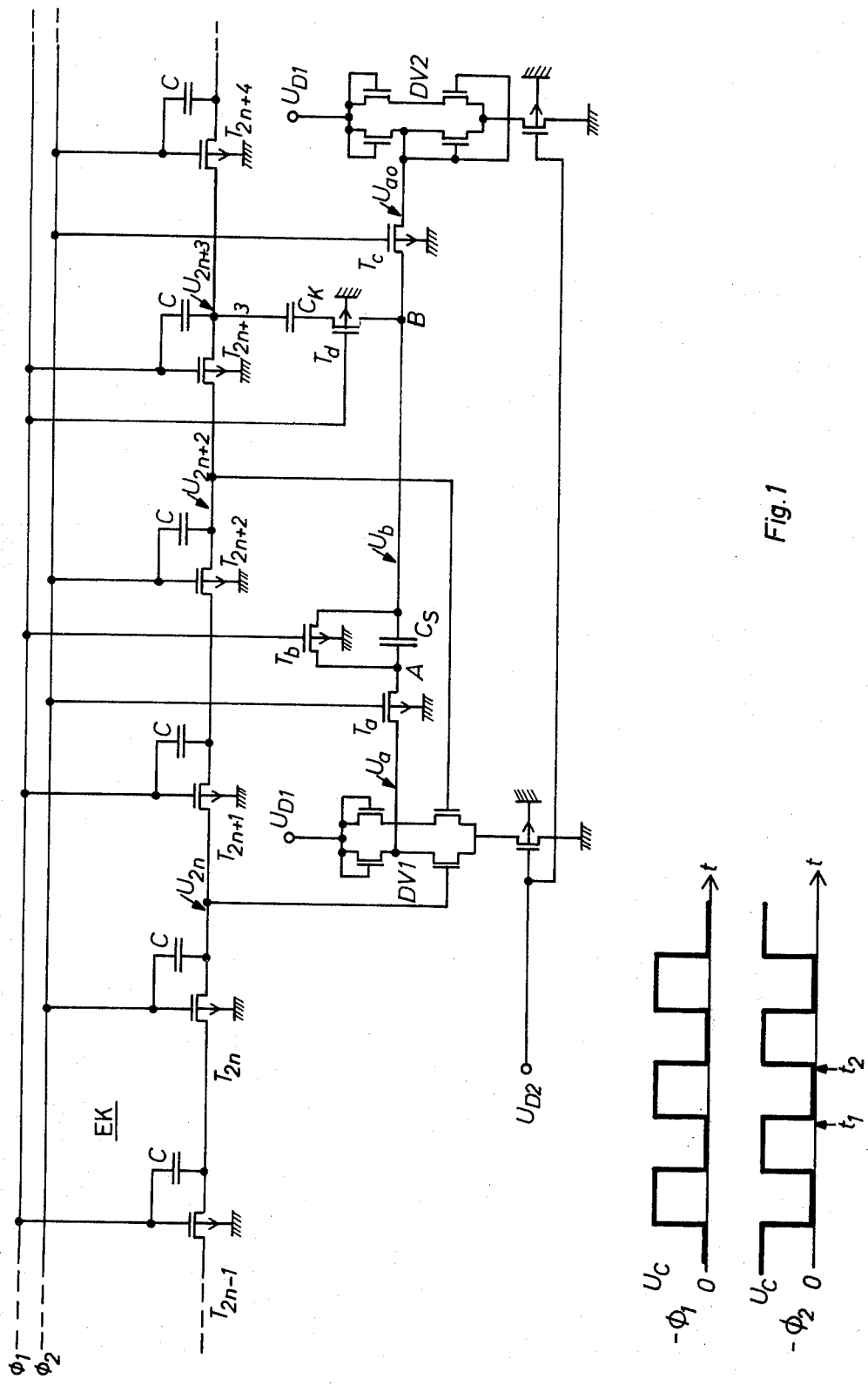
FIG. 1 is a schematic diagram of a first type of embodiment of the invention.

FIG. 1 shows a first example of embodiment of the inventive bucket-brigade circuit. In the upper half of FIG. 1 there are shown some stages of a conventional bucket-brigade circuit EK consisting of insulated p-channel field-effect transistors which, in some of the transistors, is indicated by the arrowhead on the substrate junction. Of course, it is also possible to use insulated n-channel field-effect transistors or bipolar pnp- or npn-type transistors. In the case of insulated-gate field-effect transistors it is possible to use those of the enhancement type as well as those of the depletion type.

Of the entire bucket-brigade circuit which, as is well known, may comprise several hundred stages, with the number of stages dependent upon the intended delay time and the maximum signal frequency to be transmitted, there are shown in FIG. 1 the transistors $T_{2n-1}$, $T_{2n}$, $T_{2n+1}$, $T_{2n+2}$, $T_{2n+3}$, and $T_{2n+4}$. These transistors are interconnected and arranged in series with the associated capacitors C in the manner described hereinbefore. The odd-numbered transistors $T_{2n-1}$, $T_{2n+1}$, and $T_{2n+3}$ are applied with their gate electrodes to the first clock signal $\phi_1$, and the even-numbered transistors $T_{2n}$, $T_{2n+2}$ and $T_{2n+4}$ are applied with their gate electrodes to the second clock signal $\phi_2$.

The curve as a function of the time t of these clock signals $\phi_1$ and $\phi_2$ is schematically shown in the left-hand bottom part of FIG. 1, i.e. each clock signal consists of a square-wave and equal-frequency voltage of the amplitude $U_C$, with the amplitude $U_C$ of the one clock signal lying in the interval between the effective pulses of the other clock signals, and vice versa. As will be seen, the pulse duty factor of the clock signals $\phi_1$ and $\phi_2$ as shown in FIG. 1 amounts to 0.5. It is also possible, of course, to choose a pulse duty factor varying in such a way from the aforementioned pulse duty factor that intervals will appear between the effective pulses of the two clock signals, during which both clock signals equal zero.

As is well known, the mode of operation of such a bucket-brigade circuit is such that at the end of a clock pulse every second stage, hence every odd-numbered or every even-numbered stage contains a signal information in the form of a quantity of charge stored in the associated capacitor C, while the capacitors of the stages lying inbetween are discharged and, accordingly, do not contain any information. This is due to the fact that the potentials at the corresponding junctions have all run up to the same value $U_{smax} = U_C - U_T$, thus causing the discharge via the respective transistor on the right, to come to a standstill. $U_T$ indicates in this case the threshold voltage as appearing between the gate terminal and the source terminal of the respective transistor.

The principle on which the first type of embodiments of the invention is based, namely of effecting the frequency-dependent compensation of the signal attenuation, resides in feeding the signal information, i.e. the potentials of two successively following stages containing signals, hence of two successively following odd- or even-numbered stages, to the two inputs of a differential amplifier. When the potentials of these stages, during the preceding clock signal semiperiod, have drifted to different values as would correspond to the general case, then a corresponding potential shift will result at the output of the differential amplifier which is now again reapplied capacitively to the bucket-brigade circuit at a suitable point and at a suitable time position, after the original potential difference of the two stages has been amplified to a suitable value. Since large potential differences correspond to a high signal frequency, the principle on which the invention is based, resides in a signal amplification growing as the signal frequency increases, thus compensating for the signal-dependent attenuation.

In the embodiment according to FIG. 1, the potential $U_{2n}$ at the collector terminal of transistor $T_{2n}$ is applied to the one input, and the potential $U_{2n+2}$ as appearing at the drain terminal of transistor $T_{2n+2}$ is applied to the other input of the differential amplifier DV1. This differential amplifier consists of two amplifier transistors and of two transistors connected as load resistors and which, in common, are applied to the operating voltage $U_{D1}$. The source terminals of the two amplifier transistors are connected in common, via a constant current transistor, to the zero point of the circuit, while the gate electrode of the constant current transistor is connected to the constant voltage $U_{D2}$. Accordingly, the differential amplifier DV1 is of conventional design.

The output signal of the differential amplifier DV1, after a time delay by one half the period duration of the clock signals, is applied with a time delay to the drain terminal of the transistor $T_{2n+3}$ which is the one successively following the transistor $T_{2n+2}$ far from the input of the bucket-brigade circuit. In the course of this that particular one of the two output signals of the differential amplifier DV1 is used which is not inverted with respect to its drain potential difference $U_{2n+2} - U_{2n}$ between the transistor $T_{2n+2}$ which is farther from the input of the bucket-brigade circuit and the transistor $T_{2n}$ which is closer to the input of the bucket-brigade circuit.

In order to provide that merely the signal portion of the drain potentials of the two tapped transistors after forming the difference and the amplification by the differential amplifier DV1 is again applied to the bucket-brigade circuit, care is taken that only the a.c. component thereof is re-applied to the line. As is well known, a bucket-brigade circuit is operated in such a way that to its input there is applied a constant d.c. voltage potential which is superimposed by the signal to be delayed.

For eliminating this d.c. voltage potential, the additional differential amplifier DV2 is provided for in the embodiment according to FIG. 1. The load transistors and the constant-current transistor and the power supply, is identical in design to the differential amplifier DV1. The two inputs of this differential amplifier, however, are connected to one another and are applied to the one output thereof. They may also be connected to another suitable potential, for example, to the potential $U_{D2}$ as applied to the gate electrodes of the constant-current transistors.

Owing to the connection of the two inputs of the differential amplifier DV2, there will result at the output the quiescent potential $U_{ao}$ which is identical to the potential $U_a$ at the output of the differential amplifier DV1 in cases where the drain potentials $U_{2n}$, $U_{2n+2}$ at the two inputs thereof are equal.

The output signal of the differential amplifier DV1 is applied via the source-drain path of the first additional transistor $T_a$ to one electrode of the storage capacitor $C_S$, while the output signal of the differential amplifier DV2, hence the quiescent potential $U_{ao}$, via the source-drain path of the second additional transistor $T_c$, is applied to the other electrode of the storage capacitor $C_S$. Thus, at the storage capacitor $C_S$ there can only appear as a potential difference the a.c. component of the output signal of the differential amplifier DV1.

For the purpose of erasing this potential difference, the drain-source path of the third additional transistor $T_b$ is arranged in parallel with the storage capacitor $C_S$. From point B connecting the the storage capacitor $C_S$ to the source of the additional transistor $T_c$, the source-drain path of the fourth additional transistor $T_d$ extends via the coupling capacitor $C_K$ to the drain terminal of the odd-numbered transistor $T_{2n+3}$. The gate electrodes of the additional transistors $T_a$ and $T_c$ are connected to that particular clock signal which controls the two transistors $T_{2n}$, $T_{2n+2}$ while the gat electrodes of the additional transistors $T_b$ and $T_d$ are connected to the other one of the two clock signals. Accordingly, the additional transistors $T_a$, $T_c$ are applied to the clock signal $\phi_2$ and the additional transistors $T_b$, $T_d$ are applied to the clock signal $\phi_1$.

The arrangement operates as follows. When the additional transistors $T_a$ and $T_c$ are rendered conductive, the potential $U_{ao} + \beta (U_{2n+2} - U_{2n})$ is applied to point A connecting the storage capacitor and the additional transistor $T_a$ at the time position $t_1$. $\beta$ is the differential gain factor of the differential amplifier DV1 as referred to the tapped output. During the next semiperiod of the clock signal $\phi_2$, the additional transistors $T_a$ and $T_c$ are rendered non-conductive while the additional transistors $T_b$ and $T_d$ are rendered conductive since they are controlled by clock signal $\phi_1$. Accordingly, the same potential will appear at both connecting points A and B. Under the condition that the capacitance of the storage capacitor $C_S$ is high with respect to all capacitances connected during this clock signal phase, in particular of the coupling capacitor $C_K$ and the barrier-layer capacitance of the additional transistor $T_d$, this potential, has the approximate value $$U_b = U_{ao} + \frac{\beta}{2}(U_{2n+2} - U_{2n})$$

Accordingly, the potential variation at connecting point B, between two semi-clock signal phases, will be $(\beta/2) \cdot (U_{2n+2} - U_{2n})$ Via the capacitance of the coupling capacitor $C_K$ which is low compared to the capacitance of the storage capacitor $C_S$, the correction signal $$\Delta U_{2n+3} = \frac{\beta \gamma}{2} \Delta U^{(o)}_{2n+2/2n}$$

is transferred to the collector terminal of transistor $T_{2n+3}$ at the end of this clock signal phase until time $t_2$. The following equations apply $$\Delta U_{2n+3} = U_{2n+3}(t_2) - U^{(o)}_{2n+3}(t_2)$$

$$\Delta U^{(o)}_{2n+2/2n} = U_{2n+2}(t_1) - U_{2n}(t_1) = \Delta U^{(o)}$$

$$\gamma = \frac{C_K}{C + C_K} \quad C_S \gg C_K$$

The potential $U^{(o)}_{2n+3}(t_2)$ indicates the drain potential of transistor $T_{2n+3}$ without the inventive compensation of the signal attenuation. The following applies to a simple step signal (standard jump) subsequently to the compensation of the signal attenuation:

$$U_{2n+3}(t_2) - U_{2n}(t_2) = \Delta U = (1 + \beta\gamma/2) \cdot \Delta U^{(o)} \quad (1)$$

wherein $\Delta U^{(o)}$ indicates the step signal prior to the compensation of the signal attenuation. $T_d$ may be rendered conductive prior to $T_b$ by any one of a number of known design techniques such as making the clock metallization lead to transistor $T_b$ longer than the clock metallization lead to transistor $T_d$ or by controlling parameters such as resistivity and oxide thickness. Further, the common substrate into which $T_a$, $T_b$, $T_c$ and $T_d$ are diffused completes the conduction loop from $C_s$ through $C_K$ and back to $C_s$ because each device has a common junction leakage to the substrate.

Figure 2:
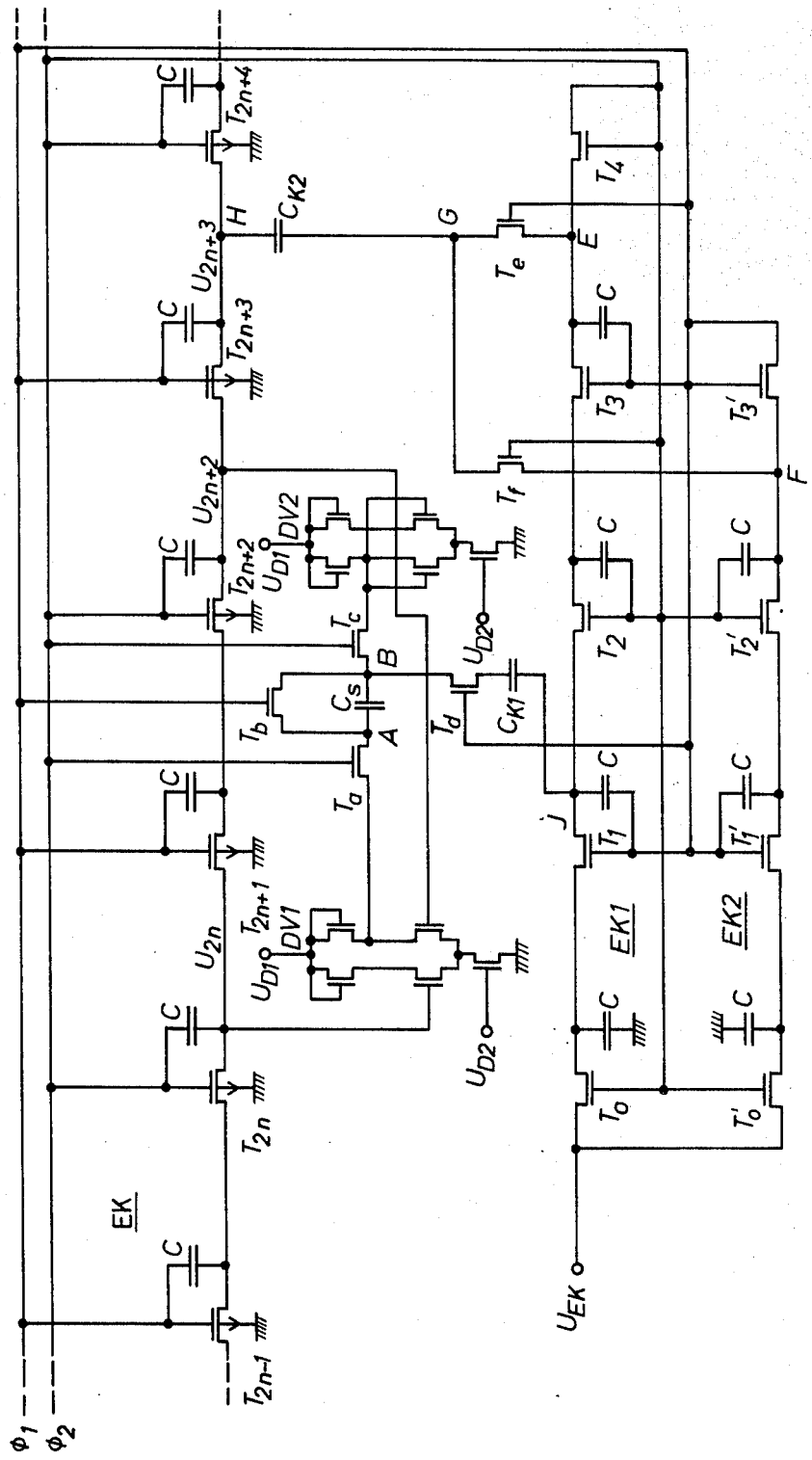
FIG. 2 is a schematic diagram of a second and preferred embodiment of the invention of said first type.

A certain disadvantage of the embodiment described with reference to FIG. 1, resides in that the phase position of the compensation signal becomes more unfavorable as the signal frequency increases. In the proximity of the maximum signal frequency this may easily cause distortions of the signal to be delayed. One embodiment of the invention which is improved in this respect and therefore, is preferred, is shown in FIG. 2. In this circuit the compensation signal composed of the difference $U_{2n+2} - U_{2n}$ is added in the inverted phase position to the signal value represented by $U_{2n}$, i.e. is subtracted, but only after this signal value has arrived at the transistor $T_{2n+3}$. In other words after a time delay by one and a half periods of the clock signals, so as not to disturb the tapping of the output signals at the transistors $T_{2n}$ and $T_{2n+2}$.

For this purpose, the output signal of the differential amplifier is taken off that particular output of the amplifier which, with respect to the drain potential difference between the transistor $T_{2n+2}$ and the transistor $T_{2n}$, inverts this potential difference. This output signal, in turn, is delayed at first by one half clock period by means of the storage capacitor $C_S$ and the circuit consisting of the additional transistors $T_a$, $T_b$, $T_c$ as well as the additional differential amplifier DV2. This part of the circuit in the embodiment according to FIG. 2 is identical to the corresponding part of the circuit according in FIG. 1, so that reference may be made to the description of FIG. 1.

Figure 4:
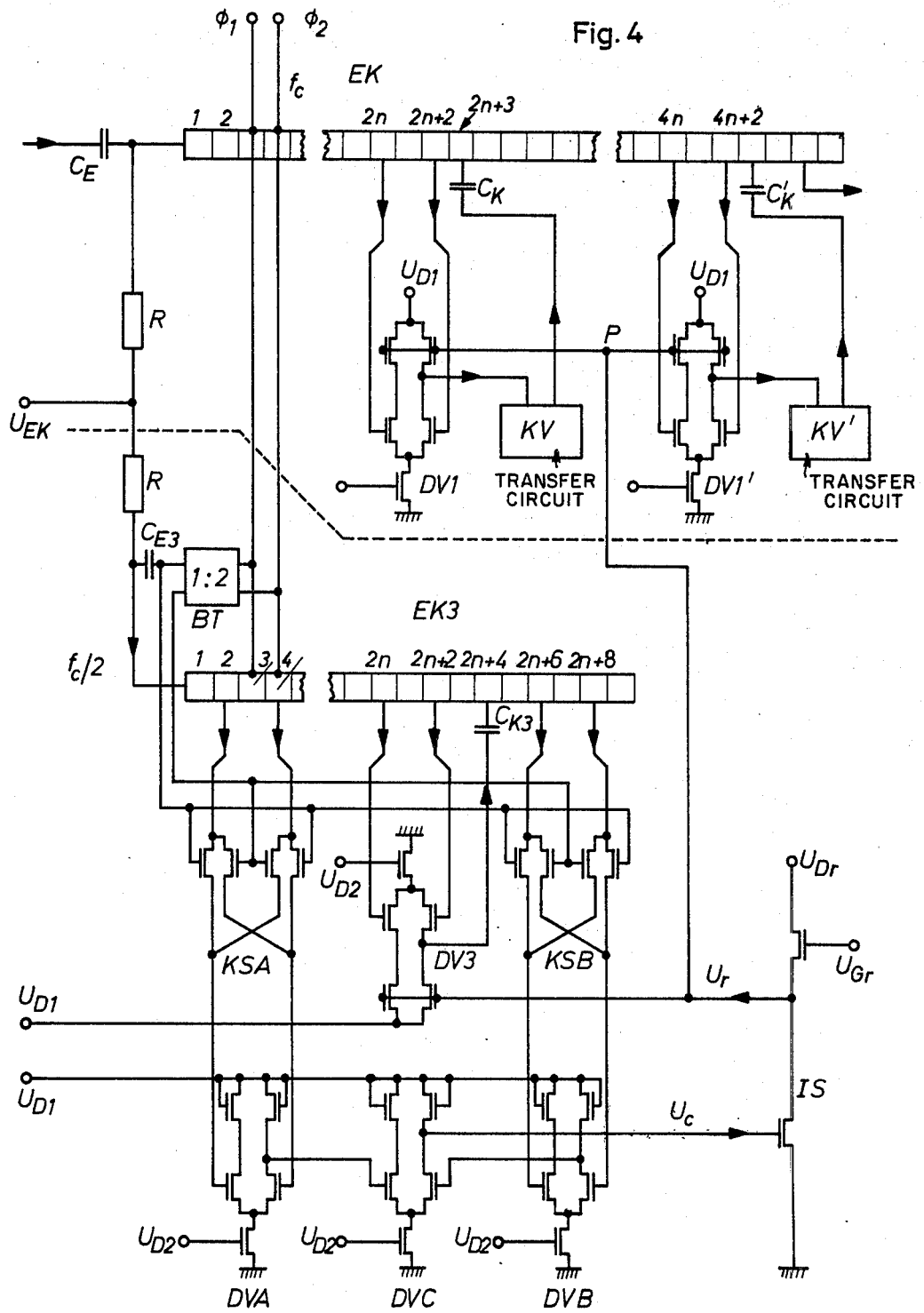
FIG. 4 is a schematic diagram of an advantageous further embodiment of the invention of said first type to which the embodiments of FIG. 1 to 3 are applicable.

At the point B connecting both the storage capacitor $C_S$ and the additional transistor $T_c$, in contrast to the arrangement in FIG. 1, the correction signal applied, is now fed via the controlled current path of the additional transistor $T_d$ and the coupling capacitor $C_{K1}$, to the a.c. signal input J of the three stage additional bucket-brigade circuit EK1. The gate electrode of the additional transistor $T_d$ is applied to the first clock signal $\phi_1$. The additional bucket-brigade circuit EK1 consists of the transistors $T_0$, $T_1$, $T_2$, $T_3$ and $T_4$, with the a.c. signal input J being identical to the drain terminal of transistor $T_1$, while at the source terminal of transistor $T_0$ there is applied the aforementioned d.c. potential $U_{EK}$ as shown in FIG. 4, across the resistor R. At the drain electrode of the third stage, hence of transistor $T_3$, there is again taken off the correction signal as applied via the coupling capacitor $C_{K1}$, in fact, this signal is applied via the source-drain path of the additional transistor $T_e$ and the further coupling capacitor $C_{K2}$ arranged in series therewith, to the drain terminal of transistor $T_{2n+3}$.

In order to suppress the d.c. component of the compensation signal as in the arrangement including the two differential amplifiers DV1, DV2, there is provided in the embodiment shown in FIG. 2, the two-stage auxiliary bucket-brigade circuit EK2 which is composed of the stages $T_0'$, $T_1'$, $T_2'$, and $T_3'$. In this case the d.c. potential $U_{EK}$ is again applied to the source terminal of transistor $T_0'$ whereas the drain terminal of transistor $T_2'$, hence point F, via the source-drain path of the additional transistor $T_f$, is connected to the point G connecting both the coupling capacitor $C_{K2}$ and the additional transistor $T_e$. The transistors $T_3'$ and $T_4$ respectively serve to terminate the two auxiliary bucket-brigade circuits EK2 and EK1 with respect to d.c. potential.

BY connecting the additional transistor $T_e$ to the first clock signal $\phi_1$, and the additional transistor $T_f$ to the second clock signal $\phi_2$, the connecting points E and F are alternately connected to the connecting point G, thereby alternating between the bucket-brigade zero potential as produced in the auxiliary bucket-brigade circuit EK2 and the bucket-brigade potential superimposed by the a.c. compensation signal, to the bucket-brigade circuit EK1. Accordingly, at the coupling capacitor $C_{K2}$ there is formed the a.c. compensation signal which is applied from there to the drain electrode of transistor $T_{2n+3}$, hence to the connection point H.

In analogy to the embodiment according to FIG. 1, the following formulas and equations are applicable:

$$\Delta U_{2n+2/2n} = U_{2n+2}(t_1) - U_{2n}(t_1) = \Delta U^{(o)}$$

$$\Delta U_{2n+3} = U_{2n+3}(t_4) - U^{(o)}_{2n+3}(t_4)$$

$$\frac{\Delta U_{2n+3}}{\Delta U_{2n+2/2n}} = \tfrac{1}{2}\beta\gamma_1\gamma_2$$

$$\gamma_1 = \frac{C_{K1}}{C + C_{K1}} \quad \gamma_2 = \frac{C_{K2}}{C + C_{K2}}$$

Relative thereto, the potential $U_{2n+3}^{(o)}(t_4)$ indicates the drain potential of transistor $T_{2n+3}$ at the time position $t_4$ without employing the inventive compensation of the signal attenuation. The time $t_4$ corresponds to the time position $t_1$ in FIG. 1 and is delayed by one and a half clock signal period durations. The following applies to the compensated step signal:

$$U_{2n+3}(t_4) - U_{2n+3}(t_4) = \Delta U = \Delta U^{(o)} \cdot (1 + \beta\gamma_1\gamma_2/2), \qquad (2)$$

wherein $\Delta U^{(o)}$ indicates the step signal mentioned hereinbefore which is subjected to the compensation of the signal attenuation.

Figure 3:
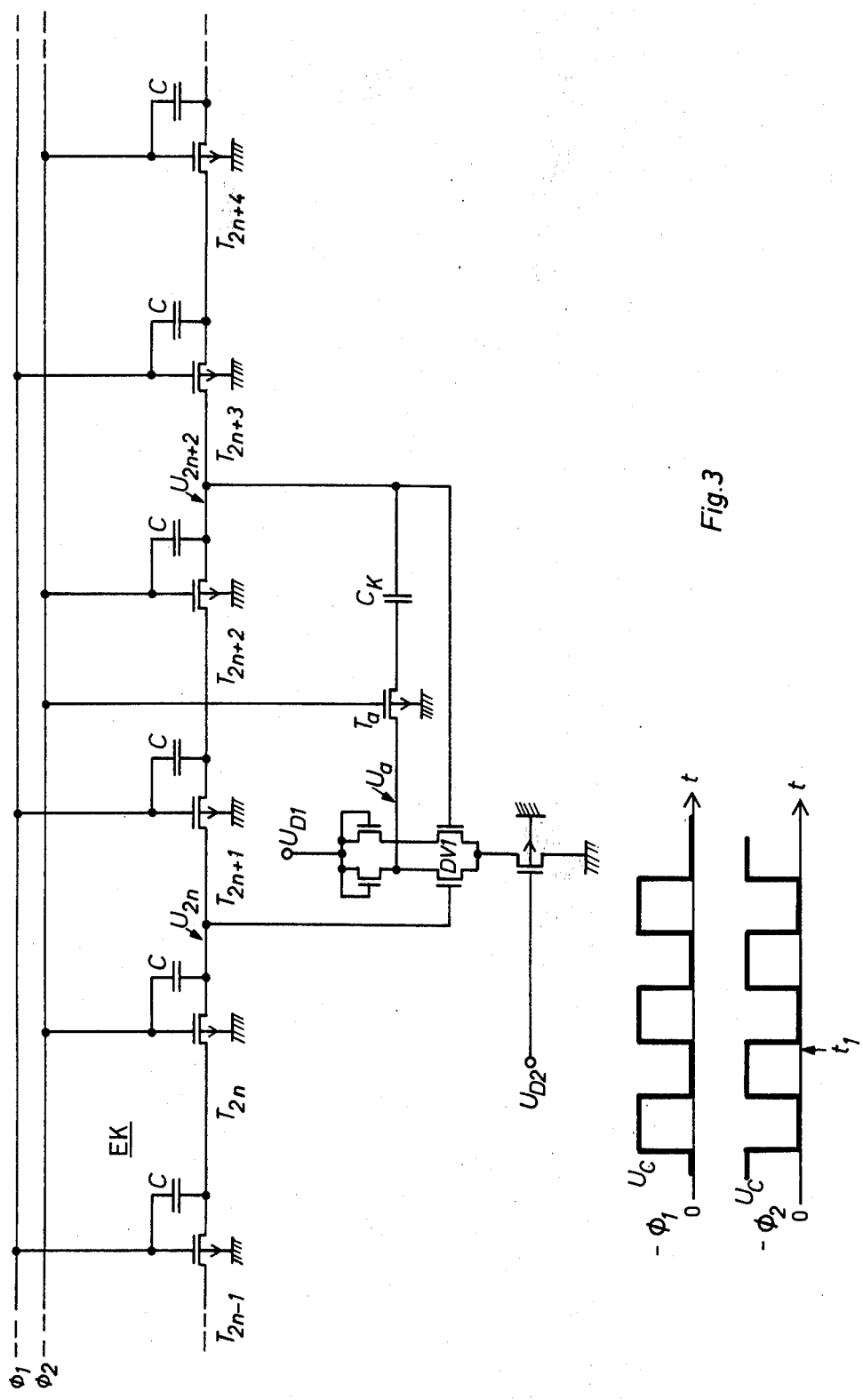
FIG. 3 is a schematic diagram of a further embodiment of the invention of said first type.

Further, in FIG. 3 there is shown a further embodiment of the invention which is substantially simplified as compared to the types of embodiment described hereinbefore. Here again, the differential amplifier DV1 is employed, as also shown in FIG. 1. The output signal of this differential amplifier DV1 which is non-inverted with respect to $U_{2n+2} - U_{2n}$, however, is fed without any time delay via the additional transistor $T_a$ and the coupling capacitor $C_K$ to the drain electrode of transistor $T_{2n+2}$.

Accordingly, at the drain electrode of transistor $T_{2n+2}$ there will result a potential increase of $$\Delta U_{2n+2} = U_{2n+2} - U^{(o)}_{2n+2} = \gamma\beta(U_{2n+2} - U_{2n})$$

or $$\frac{\Delta U_{2n+2}}{\Delta U^{(o)}_{2n+2/2n}} = \frac{\beta\gamma}{1-\beta\gamma}$$

with $$\Delta U^{(o)}_{2n+2/2n} = U^{(o)}_{2n+2} - U_{2n}$$

and $$\gamma = \frac{C_K}{C + C_K}$$

Relative thereto, $U_{2n+2}^{(o)}$ indicates the potential at the drain electrode of transistor $T_{2n+2}$ in the absence of a compensation circuit.

The following applies to the compensated step signal:

$$\Delta U = \frac{\Delta U^{(o)}}{1 - \beta\gamma}$$

By adjusting the quantity $\beta\gamma$ it is possible to optimize the compensating effect of the circuit. As will be seen, and with respect to the proper phase position, however, $\beta\gamma < 1$ must be applicable. Therefore, it is sufficient for the coupling capacitor $C_K$ to have a relatively small capacitance, and there need not be placed any high requirements on the gain B.

The additional transistor $T_a$ whose gate electrode is connected to the second clock signal $\phi_2$, insures that during those clock signal semiperiods during which the drain electrodes of the transistors $T_{2n}$ and $T_{2n+2}$ assume source properties, these electrodes are disconnected from the output of the differential amplifier DV1.

From a comparison with the formulae indicated by (1) and (2) hereinbefore, as well as formula (3) it will be seen that in the embodiments according to FIGS. 1 and 2 the compensated step signal $\Delta U$ cannot become infinite like the compensated step signal according to FIG. 3. An adjustment of the gain $\beta$ of the differential amplifier and of the capacitance ratio $\gamma$, therefore, is less critical in the embodiments according to FIGS. 1 and 2 than the embodiment according to FIG. 3.

The differential amplifiers DV1 and DV2 as shown in the embodiments according to FIGS. 1 to 3, just like the transistors of the bucket-brigade circuit and the additional transistors, are composed of transistors of the same conductivity type. It is also possible, however, to connect the differential amplifiers in such a way that the associated constant current transistor is a complementary transistor arranged between the terminal of the operating voltage $U_{D1}$ and the two load transistors, with the two sources of the amplifier transistors being connected to the zero point of the circuit.

Moreover, it is within the scope of the invention, when realizing the inventive bucket-brigade circuit with the aid of insulatedgate field-effect transistors, to add to each of the additional transistors by one insulated-gate field-effect transistor which is complementary thereto, and with the source-drain path thereof being connected in parallel with the source-drain path of the additional transistor, and with the gate electrode thereof, with respect to the clock signal of the associated additional transistor, applied to the other clock signal.

In cases where the direct control of the additional transistors according to FIGS. 1 to 3 by the clock signals should happen to be insufficient for driving them into saturation, it is possible, to provide a corresponding d.c. biasing potential at the gate electrodes, in which case the clock signals will have to be applied via capacitors.

FIG. 4 shows a further embodiment of the invention which solves the partial problem arising when the bucket-brigade circuit is to be operated at a variable clock signal frequency. In the case of a bucket-brigade circuit dimensioned for a fixed clock signal frequency $f_c$, with an associated signal attenuation compensation circuit, the gain factor $\beta$ of the differential amplifier DV1 is so dimensioned that the signal increase is at its optimum, so that a signal of the frequency $f_c/2$ is increased to the level of its input amplitude. In cases, however, where higher or lower clock signal frequencies are applied to this firmly dimensioned bucket-brigade circuit, this will imply an increase which is either insufficient or excessive.

The additional circuit shown in FIG. 4 below the dashline, however, overcomes this clock-signal frequency dependence, and insures within a certain clock signal frequency range that the gain of the differential amplifier DV1 will always be automatically set to the optimum, i.e. in such a way that a $f_c/2$-signal will again be increased to its input amplitude level.

To this end the gain factor $\beta$ of the differential amplifier DV1 is made variable in that the loaad transistors are not operated as resistors in saturation, but as amplifiers within the triode area. In the case of insulated-gate field-effect transistors they have relatively high-resistance owing to a small width-length relationship of the channel, and are controlled at their gate electrodes by a regulating potential $U_r$ lying by more than one threshold voltage above the operating voltage $U_{D1}$ of the differential amplifier DV1. The regulating potential $U_r$ is applied by the additional circuit in such a way as to effect the optimum increase.

FIG. 4 shows the main bucket-brigade circuit EK according to FIGS. 1 to 3 in a simplified representation. FIG. 4 shows two such signal attenuation compensation circuits, i.e. the additional circuit shown above the dashline on the left which is associated with the stages 2n and 2n+2 of the bucket-brigade circuit EK corresponds to the additional circuits shown in FIGS. 1 to 3, while the circuit associated with the stages 4n and 4n+2 is one further identical circuit. In FIG. 4, the bucket-brigade circuit EK comprises 4n+6 stages.

In both additional circuits the transferring circuit arranged between the corresponding output of the differential amplifier DV1 or DV1' and the associated coupling capacitor $C_K$ or $C'_K$, is indicated by KV or KV' respectively, with the different variant forms shown in FIGS. 1 to 3 and described hereinbefore, capable of being used for this transferring circuit.

The regulating potential $U_r$ of the additional circuit is produced as follows. The comparison bucket-brigade circuit EK3 which is of identical design and dimensioned in the same way as the bucket-brigade circuit EK, and which comprises 2n+9 stages, is supplied at its signal input with a signal of the frequency $f_c/2$ derived from the clock signals by means of the one-stage binary divider BT, with application being made via the capacitor $C_{E3}$, whereas the clock signals of the comparison bucket-brigade circuit EK3 are in agreement with the clock signals $\phi_1$ and $\phi_2$ of the main bucket-brigade circuit EK.

The compensation of the signal attenuation of this signal is effected with the aid of the additional differential amplifier DV3 in the same way as the signal to be delayed in the main bucket-brigade circuit EK, and which is applied thereto via the capacitor $C_E$. The inputs of the additional differential amplifier DV3 are in this case connected to the stages corresponding to the inputs of the differential amplifier DV1 of the main bucket-brigade circuit EK, i.e. to the stages 2n and 2n+2. The output signal of the additional differential amplifier DV3 is applied directly via the coupling capacitor $C_{K3}$ to the stage 2n+4. This direct application of the output signal is possible because the signal delayed in the comparison bucket-brigade circuit EK3, just like the clock signals, is a square-wave signal.

Whether, or not the increase of the $f_c/2$-signal effected by the differential amplifier DV3 is sufficient or whether it is perhaps excessive is ascertained by comparing the increased signal with the signal of a stage close to the input of the comparison bucket-brigade circuit EK3.

To this end, on one hand, the compensated signal is taken off stages 2n+6 and 2n+8, and on the other hand, the signal close to the input is taken off the stages 2 and 4, with these stages each controlled by the same clock signal $\phi_1$ or $\phi_2$, i.e. the stages 2 and 2n+6 are controlled by the other clock signal. The signals associated with the stages close to and far from the inputs are each applied via a four-way switch KSA and KSB to the inputs of a further additional differential amplifier assigned thereto, namely to the inputs of the additional differential amplifier DVA and to the inputs of the additional differential amplifier DVB respectively.

The two four-way switches KSA and KSB are clocked by two $f_c/2$-signals which are inverse in relation to one another and generated by the binary divider BT. These insure that the potential differences between the two inputs of the respective additional differential amplifiers DVA and DVB, independently of the phase position of the $f_c/2$-signal, always have the same sign. The two four-way switches each consist of four transistors, of which two are operated by the one $f_c/2$-signal, and two by the other $f_c/2$-signal via their gate electrodes. Moreover, a transistor applied to the first $f_c/2$-signal and a transistor applied to the second $f_c/2$-signal are connected with their drain electrodes in common to the corresponding stage of the comparison bucket-brigade circuit, while the source electrode of one of these two transistors is connected to the corresponding source electrode of one of the two other transistors of the respective four-way switch.

The potentials occurring at respectively one of the outputs of the additional differential amplfiers DVA and DVB are applied to the inputs of the further additional differential amplifier DVC. At one of the outputs of this additional differential amplifier there is taken off the potential $U_c$ which is used to control the inverter stage IS, at the output of which there may finally be taken off the regulating potential $U_r$.

The inverter stage IS consists of a transistor and of a further transistor acting as load resistor and which, for example, at its gate electrode, may be operated by the constant potential $U_{Gr}$ and, at its drain, by the constant potential $U_{Dr}$. The regulating potential $U_r$ is applied to the gate terminals of the load transistors of the differential amplifiers DV1 or DV1', as well as to the gate terminals of the load transistors of the additional differential amplifier DV3.

The interconnection of the $f_c/2$-signals, of the four-way switch outputs and of the additional differential amplifier outputs in relation to each other, as shown in FIG. 4, is chosen such that in the case of a decreasing signal compensation in the comparison bucket-brigade circuit EK3, the regulating potential $U_r$ will decrease, so that the load transistors of the differential amplifiers DV1, DV1' and DV3 as controlled thereby, and also, the additional differential amplifiers DV2 and DV2' according to FIGS. 1 and 2, will become more highly resistive, thus causing an increased gain of the differential amplifiers.

The gain factor of the inverter stage IS is designed sufficiently large to insure that the differential gain of the differential amplifiers DV1, DV1', DV2, DV2' will always effect an optimum compensation of the signal attenuation in the bucket-brigade circuit EK and the comparison bucket-brigade circuit EK3.

In order that the stages 2 and 4 as well as 2n+6 and 2n+8 of the comparison bucket-brigade circuit EK3 are loaded as little as possible by the tappings, it is possible to insert between them and the four-way switch input an inverter stage each or an impedance transformer state of the emitter-follower type having a low input capacitance. When using inverter stages there will have to be used at the additional differential amplifier DVC the output other than the one shown in FIG. 4 in order to achieve the intended negative feedback control effect.

The potentials $U_{Dr}$ and $U_{Gr}$ of the inverter stage IS must be chosen to be sufficiently high for safeguarding that the regulating potential $U_r$ which is always supposed to lie by at least one threshold voltage value about the operating voltage $U_{D1}$ of the differential amplifiers, will become sufficiently high.

Figure 6:
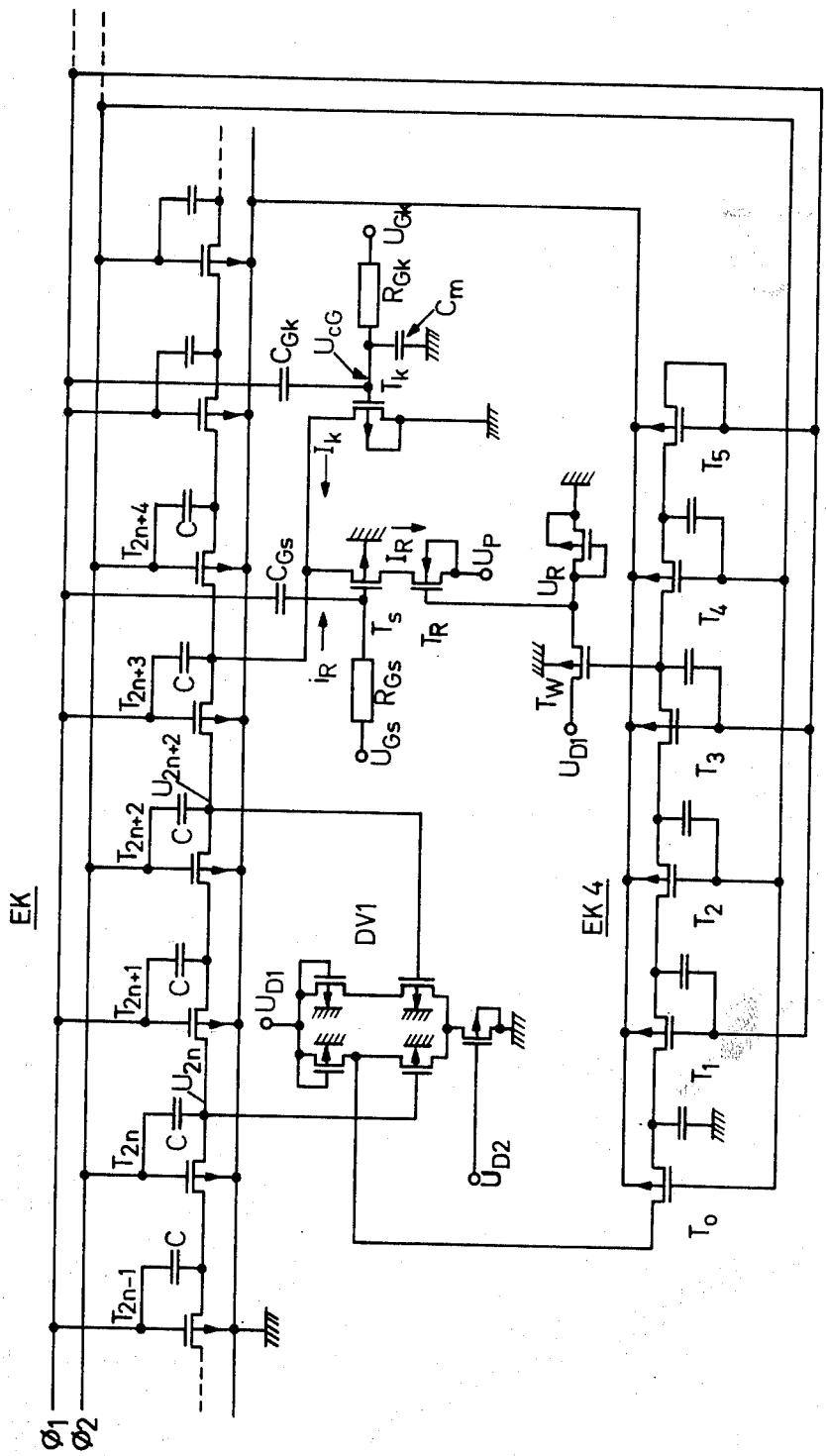
FIG. 6 is a diagram of a circuit for compensating the signal attentuation for use in a bucket-brigade circuit consisting of p-channel insulated-gate field-effect transistors according to FIG. 5.

The FIG. 6 to 10 show a second type of embodiment of the inventive bucket-brigade circuit. In the upper half of FIG. 6 there are schematically shown some stages of a conventional bucket-brigade circuit EK. Of the entire bucket-brigade circuit which, as is well known, may be in the order of several hundred stage, with the number of stages being dependent upon the intended delay time and the maximum signal frequency to be transmittted. Shown in FIG. 6 are the stages 0 to 4 and $2n-1, 2n, 2n+1, 2n+2, 2n+3$ annd $2n+4$.

In this the odd-numbered stages are controlled by the first clock signal $\phi_1$ and the even-numbered stages are controlled by the second clock signal $\phi_2$.

The principle on which the second type of embodiment of invention is based, namely of effecting the frequency-dependent compensation of the signal attenuation, resides in feeding the signal information, i.e. the potentials of two successive stages containing signals, hence of two successive following odd- or even-numbered stages, to the two inputs of a differential amplifier. When the potentials of these stages, during the preceding clock signal semiperiod, have drifted to different values as it would in the general case, then a corresponding potential potential shift will result at the output of the differential amplifier which is used for generating a proportional current pulse for re-application to the bucket-brigade circuit at a suitable point. Since large potential differences correspond to a high signal frequency, the principle on which the invention is based, causes a signal amplification which increases as the signal frequency increases, thus compensating for the signal-dependent attenuation.

Figure 5:
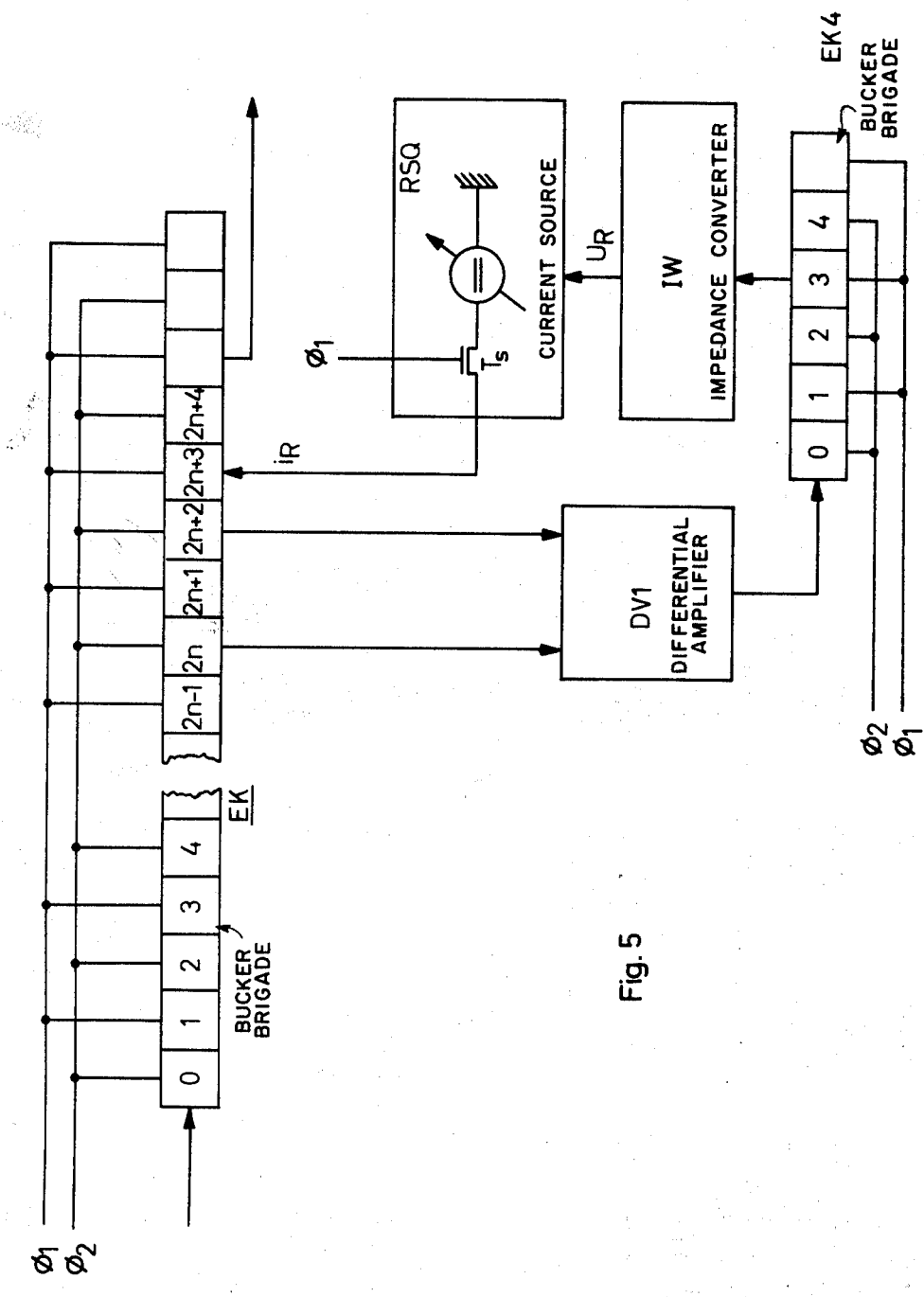
FIG. 5 is a schematic diagram of a second type of embodiment of the invention.

In FIG. 5 the output signal of the differential amplifier DV1 is delayed in the auxiliary bucket-brigade circuit EK4, i.e. during one and a half clock signal periods, and is then fed to the controlled constant current source RSQ via the impedance converter IW.

The output of the controlled constant current source is galvanically fed, via the source-drain path of the additional transistor $T_s$, to the stage $2n+3$ of the bucket-brigade circuit EK, with the gate electrode of the additional transistor $T_s$ controlled by the first clock signal $\phi_1$, hence by the same clock signal which also controls that particular stage to which the current pulse of the constant current source is fed galvanically.

The odd-numbered stages of the auxiliary bucket-brigade circuit EK4 are likewise controlled by the clock signal $\phi_1$, and the even-numbered stages thereof are controlled by the clock signal $\phi_2$.

In a good approximation, the current pulse $i_R$ as supplied by the controlled constant current source is a linear function of the regulating potential $U_R$ taken off the auxiliary bucket-brigade circuit EK4. Moreover, the current pulse $i_R$ becomes zero with respect to a certain regulating potential $U_{Ro}$, with this regulating potential $U_{Ro}$ being so defined that it will appear when no differential signal is applied to the inputs of the differential amplifier, i.e. when the two input potentials are alike. Finally, the polarity of the current pulse $i_R$ is reversed whenever the regulating potential $U_R$ passes through $U_{Ro}$, so that the following is a good approximation:

$$i_R = g_o(U_R - U_{Ro}),$$

wherein $g_o$ substantially corresponds to the mutual conductance of the transistor $T_R$ (see FIG. 6).

FIG. 6 shows an example of embodiment of the second type which is essentially composed of p-channel insulated-gate field-effect transistors, preferably designed as in integrated circuit. To the aforementioned numbers of stages there now correspond the transistors $T_{2n-1}, T_{2n}, T_{2n+1}, T_{2n+2}, T_{2n+3}$, and $T_{2n+4}$. These transistors are interconnected and arranged in series with the associated capacitors C in the manner already described hereinbefore. The potential $U_{2n}$ at the drain terminal of transistor $T_{2n}$ is applied to the one input, while the potential $U_{2n+2}$ at the drain terminal of transistor $T_{2n+2}$ is applied to the other input of the differential amplifier DV1. This differential amplifier consists of two amplifier transistors and of two transistors connected as load resistors and which, in common, are applied to the operating voltage $U_{D1}$. The source electrodes of the two amplifier transistors are connected in common via a constant current transistor, to the zero point of the circuit, while the gate electrode of the constant current transistor is connected to the constant voltage $U_{D2}$. Accordingly, the differential amplifier DV1 is of conventional design.

The differential amplifier DV1 is so dimensioned that in the case of a disappearing differential signal at the input, the output potential will almost correspond to the optimum operating level of the auxiliary bucket-brigade circuit EK4, so that one of the outputs of the differential amplifier DV1 can be connected directly to the signal input of the auxiliary bucket-brigade circuit EK4, as is indicated in FIG. 6 with respect to the non-inverted output.

The auxiliary bucket-brigade EK4 is likewise composed of p-channel insulated-gate field-effect transistors, namely of the transistors $T_0, T_1, T_2, T_3, T_4$ and $T_5$. The two last-mentioned transistors provide the proper termination of the auxiliary bucket-brigade circuit, with the drain electrode of the last transistor $T_5$ being connected to the gate electrode thereof.

The output of the third delaying stage of the auxiliary bucket-brigade circuit, hence the drain electrode of tranistor $T_3$, is connected to the gate electrode of transistor $T_W$ whose drain is applied to the operating voltage $U_{D1}$ and whose source is connected to the zero point of the circuit via a further transistor which is connected as a resistor. Accordingly, the combination of these two stages represents a conventional impedance converter. The regulating potential $U_R$ appearing at the source of transistor $T_W$, is now applied to the gate electrode of transistor $T_R$ operated as a common-emitter circuit, and which is complementary to the remaining transistors in the total circuit, i.e. this transistor is an n-channel insulated-gate field-effect transistor. The source of this transistor is applied to negative potential $U_p$ while its drain is connected via the additional transistor $T_s$ which, in turn, is a p-channel insulated-gate field-effect transistor, to the drain of transistor $T_{2n+3}$ of the bucket-brigade circuit EK. The gate electrode of the additional transistor $T_s$, via the capacitor $C_{Gs}$, is coupled to the first clock signal $\phi_1$ and further to the potential $U_{Gs}$ across the high-ohmic resistor $R_{Gs}$.

Furthermore, another p-channel insulated-gate field-effect transistor $T_k$ likewise operated in a common-emitter circuit, is connected to the drain electrode of transistor $T_{2n+3}$, with the gate electrode of said IGFET $T_k$ being connected via the capacitor $C_{Gk}$, to the clock signal $\phi_1$, via the capacitor $C_m$ to the zero point of the circuit, and across the high-ohmic resistor $R_{Gk}$, to the d.c. potential $U_{Gk}$.

Accordingly, the transistors $T_{2n+3}$, $T_s$ and $T_k$ are always rendered conductive or non-conductive at equal times. The d.c. potentials $U_{Gs}$ and $U_{Gk}$ are so dimensioned that during the corresponding semiperiods of the clock signals the transistors $T_s$ and $T_k$ are rendered completely conductive or non-conductive respectively. If so required, the transistor $T_R$ can be rendered non-conductive directly by the regulating potential $U_R$ during the respective semiperiods. In cases where this is safeguarded, the additional transistor $T_s$ may be omitted.

Accordingly, the clock pulse amplitude effective at the gate terminal of the additional transistor $T_k$ is $$U_{cG} = U_c \frac{C_{Gk}}{C_{Gk} + C_m} (U_c = \text{full clock pulse amplitude})$$

Both the d.c. potential $U_{Gk}$ and the clock pulse amplitude $U_{cG}$ may be selected in such a way, for example, by suitably dimensioning the capacitances $C_{Gk}$ and $C_m$, that the current $I_k$ as flowing through the transistor $T_k$ will just compensate the current flowing in the transistor $T_R$ in case $U_R = U_{Ro}$, so that the regulating current pulse $i_R$ will become zero.

By taking action at two points of the circuit it is possible to reverse the sign of the current pulse $i_R$, namely in that on one hand the outputs of the differential amplifier are interchanged and, on the other hand, in that the impedance converter stage including the transistor $T_W$ is replaced by an inverter stage. The sign of the regulating current pulse $i_R$ will be maintained in cases where these two changes are carried out simultaneously. FIG. 6 shows one of these possible arrangements for applying the regulating current pulse $i_R$ in proper phase relation to the drain electrode of transistor $T_{2n+3}$ of the bucket-brigade circuit EK.

The circuit of the controlled constant current source as shown in FIG. 6 remains completely equivalent in its function when the transistor $T_R$ is designed as a p-channel instead of as an n-channel insulated-gate field-effect transistor, and when the additional transistor $T_k$ is designed as an n-channel instead of as a p-channel insulated-gate field-effect transistor, and when the potential $U_p$ as applied to the respective sources, is replaced by the potential of the zero point of the circuit and vice versa. At the same time, the transistor $T_k$ must also be controlled by the other clock signal, hence by the clock signal $\phi_2$, and the d.c. potential $U_{Gk}$ must be adapted accordingly.

Moreover, when correspondingly changing the driving control, also the additional transistor $T_s$ may be replaced by an n-channel insulated-gate field-effect transistor (IGFET).

Of course, the differential amplifier DV1 may also be designed differently; thus, for example, the constant current transistor of the differential amplifier DV1 may be replaced by a complementary, i.e. an n-channel transistor which, in this case, however, must be arranged between the two load transistors and the d.c. potential $U_{D1}$.

Furthermore, the two parallel-arranged inverters of the differential amplifier halves can also be replaced by two inverters designed in accordance with the complementary IGFET technology (CMOS-inverter).

Also, all transistors of the differential amplifier may be replaced by complementary ones, and the potentials may be interchanged.

Figure 7:
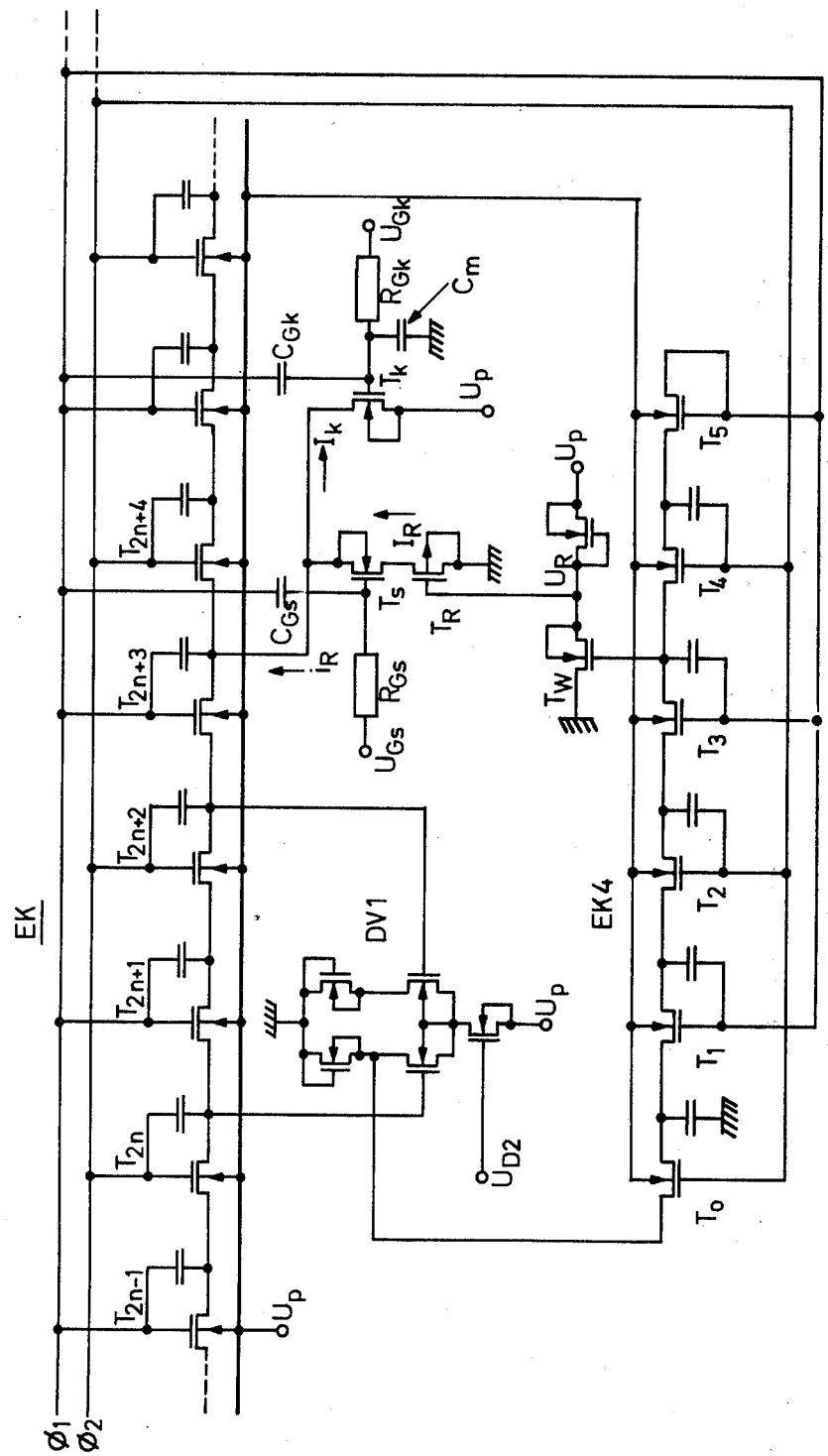
FIG. 7 is a diagram of a circuit for compensating the signal attenuation for use in a bucket-brigade circuit consisting of n-channel insulated-gate field-effect transistors according to FIG. 5.

FIG. 7 shows a further embodiment employing n-channel IGFETs which is completely complementary to the example shown in FIG. 6. In particular, the transistor $T_R$ in FIG. 7 is a p-channel IGFET. Moreover, the potential $U_{D1}$ in FIG. 7 is connected to all points of the circuit to which, there is applied the potential of the zero point of the current (except for the terminal of capacitor $C_m$ at the zero point of the circuit), while to all other points coupled to potential $U_{D1}$, there is applied in FIG. 7 the potential of the zero point of the circuit.

The inventive principle of deriving a current pulse which is in proportion to the output signal of the differential amplifier DV1 and the galvanic feeding-in of this pulse in the proper phase relation, to the bucket-brigade circuit, may also be applied in a corresponding way to the further embodiment shown in FIG. 4 above.

Figure 8:
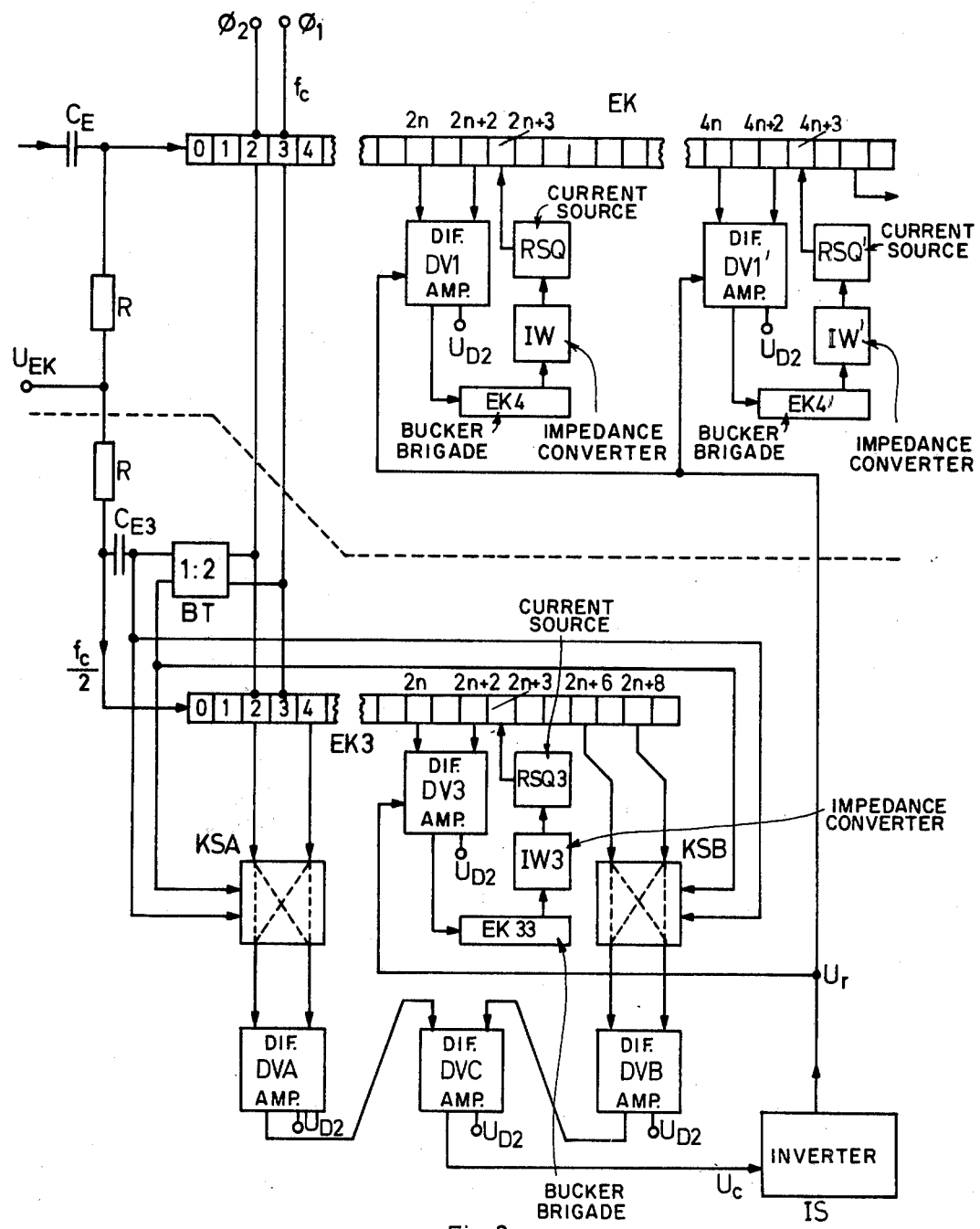
FIG. 8 shows the principle of a self-regulating circuit for compensating the signal attenuation employing the embodiment of FIG. 5.
Figure 9:
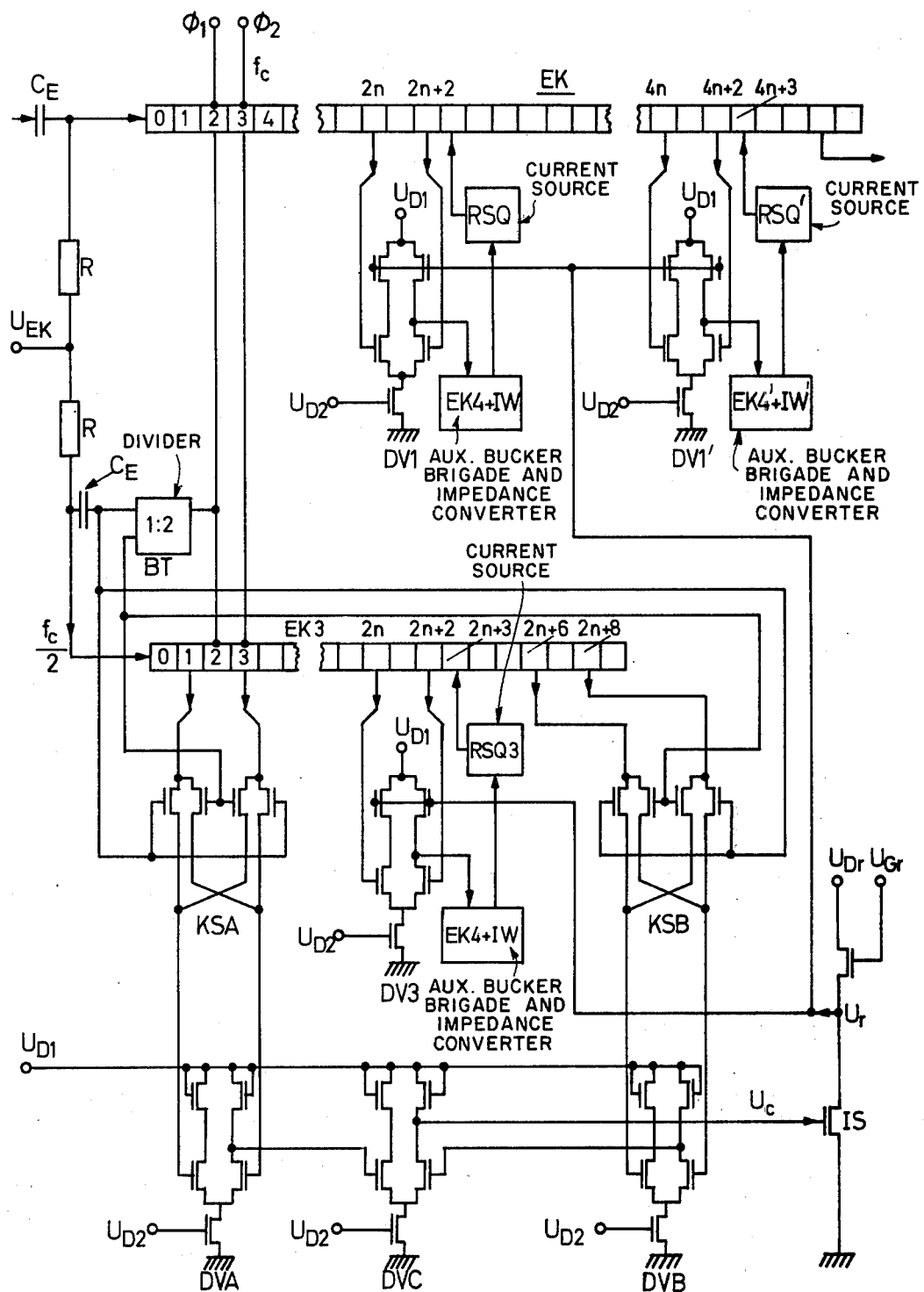
FIG. 9 shows an embodiment of the self-regulating circuit for compensating the signal attenuation according to FIG. 8.

FIGS. 8 and 9 show a further embodiment of the invention which operate at variable clock pulse frequencies as already explained above.

The additional circuit shown below the dashline in FIG. 8, however, overcomes this clock frequency dependence and insures that the gain of the differential amplifier DV1 will always automatically adjust itself to the optimum within a certain clock frequency range, i.e. in such a way that an $f_c/2$-signal is again raised to the level of its input amplitude.

To this end the gain factor $\beta$ of the differential amplifier DV1 is made variable in that the load transistors are not driven as resistors into saturation, but are operated as amplifiers within the triode area. In the case of IGFETs they are designed with relatively high-resistance by providing for a small width-length relationship of the channel region, and are controlled at their gate electrodes by a regulating potential $U_r$ lying by more than one threshold voltage above the operating voltage $U_{D1}$ of the differential amplifier DV1. The regulating potential $U_r$ is adjusted by the additional circuit in such a way as to effect the optimum raising.

FIG. 8 shows the main bucket-brigade circuit EK according to FIGS. 4 to 7 in a simplified representation. For explaining the fact that the circuits for effecting the compensation of the signal attenuation, shown in FIGS. 4 to 7, may also be provided for several times in one bucket-brigade circuit, two such attenuation compensation circuits are shown in FIG. 8, i.e. the additional circuit shown on the left above the dashline and associated with the stages $2n$ and $2n+2$ of the bucket-brigade circuit EK, corresponds to the additional circuits shown in FIGS. 4 to 7, while the circuit associated with the stages in $4n$ and $4n+2$ is one such further identical circuit.

The bucket-brigade circuit EK as shown in FIG. 8 comprises $4n+7$ stages.

In both additional circuits the transferring circuit consisting of the parts RSQ, IW, EK4 or RSQ', IW', EK4' is arranged between the corresponding output of the differential amplifiers DV1 or DV1' and the stages $2n+3$ or $4n+3$ respectively, with the different variant forms as shown in FIGS. 4 to 7 and described hereinbefore being suitable for use in connection with this transferring circuit.

The regulating potential $U_r$ of the additional circuit is produced in the following way. To the comparison bucket-brigade circuit EK3 which, in its design and dimensions is identical to the bucket-brigade circuit EK, and comprises $2n+9$ stages, there is applied, via the capacitor $C_{E3}$, a signal of the frequency $f_c/2$ derived from the clock signals by means of the single-stage binary divider BT. The clock signals of the comparison bucket-brigade circuit EK3 are in agreement with the clock signals $\phi_1$ and $\phi_2$ of the main bucket-brigade circuit EK. Moreover, both the main bucket-brigade circuit and the comparison bucket-brigade circuit are applied to d.c. potential $U_{EK}$, each across one resistor R.

This signal, by means of the additional differential amplifier DV3 is compensated as regards its attenuation in the same way as the signal to be delayed in the main bucket-brigade circuit EK and which is applied thereto via the capacitor $C_E$. The inputs of the additional differential amplifier DV3 are in this case connected to the stages corresponding to the inputs of the differential amplifier DV3 of the main bucket-brigade circuit EK, namely to the stages $2n$ and $2n+2$. The output signal of the additional differential amplifier DV3, after having been converted in an inventive transferring circuit RSQ3, IW3, EK33, serves to control the stage $2n+3$.

By way of comparing the raised signal with the signal of a stage close to the input of the comparison bucket-brigade circuit EK3, it is now ascertained whether or not the raising of the $f_c/2$-signal by the differential amplifier DV3 is just sufficient or whether amplification has probably been to an excessive extent.

To this end the compensated signal is taken from stages $2n+6$ and $2n+8$ and, on the other hand, the signal close to the input is taken from the stages 2 and 4, with these stages each controlled by the same clock signal $\phi_1$ or $\phi_2$, i.e. the stages 2 and $2n+6$ are controlled by the one, and the stages 4 and $2n+8$ are controlled by the other clock signal. The associated signals of both the stages close to and far from the input are each applied via a fourway switch KSA and KSB to the inputs of an associated additional differential amplifier, namely to the inputs of the additional differential amplifier DVA and to the inputs of the additional differential amplifier DVB.

The two four-way switches KSA and KSB are clocked by two $f_c/2$-signals which are inverse in relation to one another and originate with the binary divider BT. This provides that the potential differences between the two inputs of the respective additional differential amplifiers DVA and DVB always have the same sign independently of the phase relation of the $f_c/2$-signal. According to FIG. 9, the two four-way switches each consist of four transistors of which two are operated at the one $f_c/2$-signal, and two at the other $f_c/2$-signal via their gate electrodes. Moreover, one transistor applied to the first $f_c/2$-signal and one transistor applied to the second $f_c/2$-signal are connected with their drain electrodes in common to the corresponding stage of the comparison bucket-brigade circuit, while the source electrode of one of these two transistors is connected to the corresponding source electrode of one of the two other transistors of the respective four-leg switch.

The potentials respectively occurring at one of the outputs of the additional differential amplifiers DVA and DVB are fed to the two inputs of the further additional differential amplifier DVC. At one of the outputs of this additional differential amplifier there is taken off the potential $U_c$ which is used for controlling the inverter stage IS at the output of which, finally, the regulating potential $U_r$ may be taken off.

The inverter stage IS, according to FIG. 9, consists of a transistor in combination with a further transistor acting as a load resistor and which, for example, at its gate electrode, may be operated by the constant potential $U_{Gr}$ and, at its drain, by the constant potential $U_{Dr}$. The regulating potential $U_r$ is fed to the gate electrodes of the load transistors of the differential amplifiers DV1 and DV1', as well as to the gate terminals of the load transistors of said additional differential amplifier DV3.

The interconnection of the $f_c/2$ signals, of the four-way switch outputs and of the additional differential amplifier outputs to one another, as shown in FIGS. 8 and 9, is chosen such that the regulating potential $U_r$ will decrease as the signal compensation of the comparison bucket-brigade circuit EK3 decreases, so that the load transistors of the differential amplifiers DV1, DV1' and DV3 as controlled thereby, will become more highly resistive and will thus lead to an increased gain of the differential amplifiers controlled by the regulating potential.

The gain factor of the inverter stage IS designed sufficiently large such that the differential gain of the differential amplifiers DV1, DV1' and DV3 will always effect an optimum compensation of the signal attenuation in the bucket-brigade circuit EK and the comparison bucket-brigade circuit EK3.

In order that the stages 2 and 4 as well as $2n+6$ and $2n+8$ of the comparison bucket-brigade circuit EK3 are loaded as little as possible by the tappings, it is possible to insert between them and the four-way switch input an inverter stage or an impedance transformer stage of the emitter-follower type having a low input capacitance. When using inverter stages there is used at the additional differential amplifier DVC the output other than the one shown in FIGS. 8 and 9, in order to achieve the intended negative feedback control effect.

Figure 10:
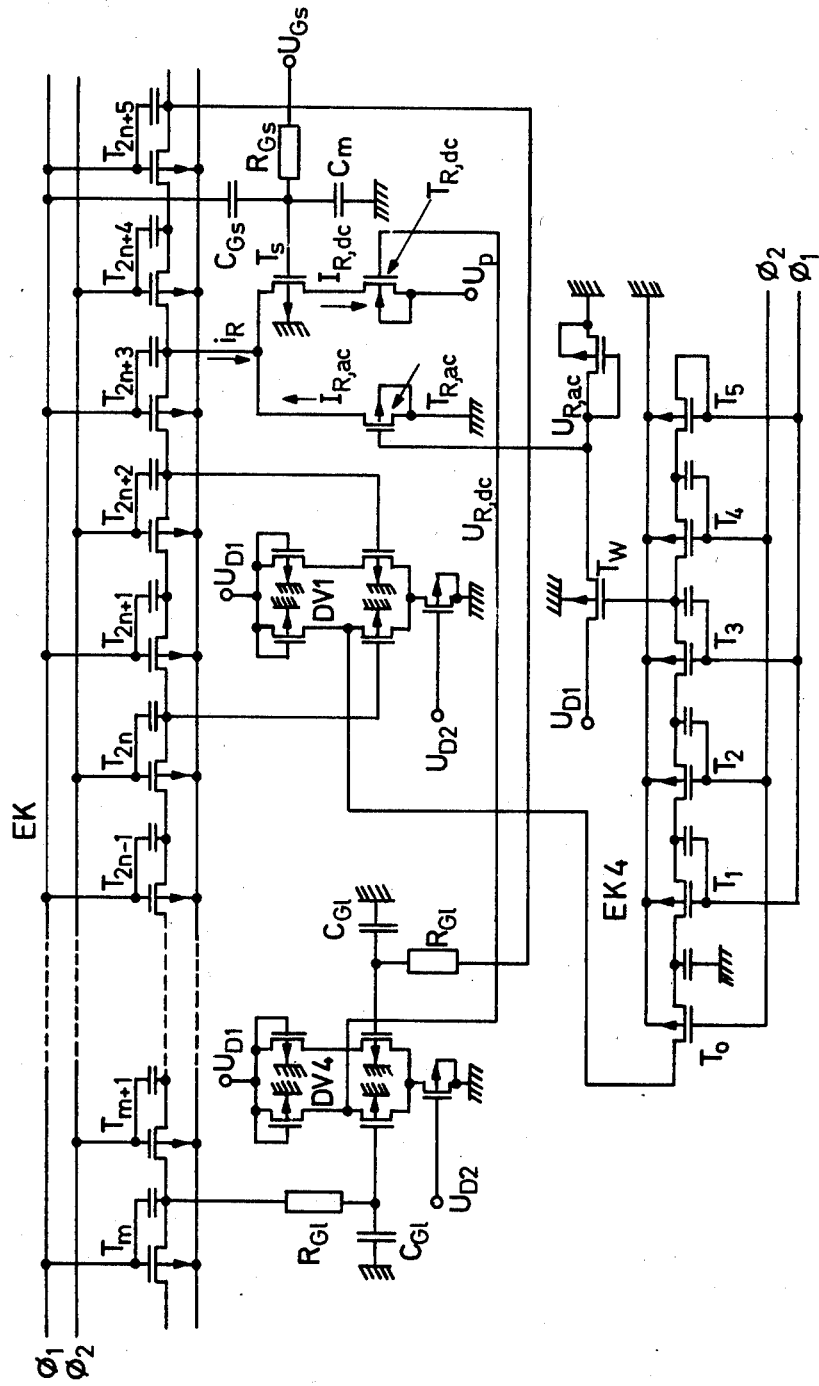
FIG. 10 shows the circuit for compensating the signal attenuation according to FIG. 6 by providing for a simultaneous d.c. level regeneration.

The potential $U_{Dr}$ and $U_{Gr}$ of the inverter stage IS must be chosen to be sufficiently high for safeguarding that the regulating potential $U_r$, which is always supposed to lie at least one threshold voltage value above the operating voltage $U_{D1}$ of the differential amplifiers, will become sufficiently high. FIG. 10 finally shows the common use of both the signal compensation circuit and a d.c. level regenerating circuit as described in copending application Serial No. From the simultaneous use of these two circuits there will result the advantage that as the additional constant current source there may be used the transistor $T_{R,dc}$ generating the regulating current pulse $I_{R,dc}$ of the d.c. level regenerating circuit and which, accordingly, replaces in FIG. 10 the transistor $T_k$ according to FIGS. 6 and 7. The additional transistor $T_s$ which is controlled by the clock signal $\phi_1$, is connected in series with the transistor $T_{R,dc}$ instead of being connected in series with the transistor $T_R$ as in FIGS. 6 and 7.

The principle of the d.c. voltage level regeneration or of keeping constant the input d.c. voltage level resides in feeding the potentials of a stage close to the input of a bucket-brigade circuit and of a stage far from the input of a bucket-brigade circuit, subsequently to a corresponding suppression of the signal component, to the two inputs of a differential amplifier, and in re-applying a current pulse which is in proportion to the input signal thereof, galvanically to one of the transistors preceding the transistor arranged far from the input of the bucket-brigade circuit. In FIG. 10, the transistor close to the input of the bucket-brigade circuit is the transistor $T_m$, and the transistor far from the input of the bucket-brigade circuit, is the transistor $T_{2n+5}$.

In FIG. 10, the transistor preceding the transistor $T_{2n+5}$ far from the input of the bucket-brigade circuit, is the transistor $T_{2n+3}$. As the transistor $T_m$ close to the input of the bucket-brigade circuit, there is preferably chosen the first delaying transistor of the bucket-brigade circuit, at the drain electrode of which the d.c. potential still has its full rated value for safeguarding an optimum controlling of the bucket-brigade circuit. The signals as taken off the collector electrodes of the two transistors $T_m$ and $T_{2n+5}$ are each fed across the high-ohmic resistors $R_{G1}$, to the two inputs of the differential amplifier DV4 which is similar in design as the differential amplifier DV1.

Furthermore, the two inputs are each connected to the zero point of the circuit via the capacitor $C_{G1}$, with the resistance value of $R_{G1}$ and the capacitance of the capacitor chosen such that the RC-combination will act as a low-pass filter for the signal frequencies of the bucket-brigade circuit to be delayed. In cases where the bucket-brigade circuit is realized in integrated form, it will be impossible to integrate the filter-capacitors as well, owing to their great surface requirement, so that they will have to be connected to the integrated circuit from the outside.

The two transistors $T_m$ and $T_{2n+5}$, at which the input signals for the differential amplifier DV4 are taken off, are both odd-numbered transistors controlled by the same clock signal $\phi_1$, thus safeguarding that the two stages are always in the same state. Of course, it is also possible to use two even-numbered stages for taking off the input signals of the differential amplifier DV4, which would then have to be connected to the clock signal $\phi_2$.

In FIG. 10, the current pulse $I_{R,dc}$ which is in proportion to the output signal of the differential amplifier DV4, is galvanically fed to the collector of transistor $T_{2n+3}$ far from the input of the bucket-brigade circuit, and which precedes the transistor $T_{2n+5}$. In the course of this there is used that particular one of the two output signals of the differential amplifier DV4 which is not inverted with respect to the drain potential difference $U_{2n+5} - U_m$ between the transistor $T_{2n+5}$ far from the input of the bucket-brigade circuit and the transistor $T_m$ close to the input of the bucket-brigade circuit.

It is to be understood that the foregoing description of specific examples of this invention is made by way of example only and is not to be considered as a limitation on its scope.

We claim:

1. A bucket brigade circuit wherein there is provided a plurality of stages which are all of the same kind, each consisting of a transistor and a capacitor coupled between the gate and drain terminal thereof, and coupled together such that the drain terminal of each transistor is connected to the source terminal of the next successive transistor, wherein the gate terminals of even-numbered transistors are controlled by a first square wave clock signal; and the gate terminals of odd-numbered transistors are controlled by a second square wave clock signal of the same frequency having effective pulses lying in the intervals between effective pulses of said first clock signal comprising:
a first differential amplifier (DV1) having first and second inputs, said first input coupled to the drain of a first transistor ($T_{2n}$) and said second input coupled to the drain of a second transistor ($T_{2n+2}$), said first and second transistors each contained in first and second alternate stages of said plurality of stages; said first differential amplifier having first and second outputs, said first output coupled to the drain terminal of one of the transistors in said bucket brigade circuit.

2. A bucket brigade circuit according to claim 1 wherein said first output is capacitively coupled to the drain of said first transistor.

3. A bucket brigade circuit according to claim 1 wherein said first output is galvanically coupled to the drain of said first transistor for applying a current pulse $i_R$ which is proportional to said first and second outputs.

4. A bucket brigade circuit according to claim 1 wherein said first of said transistors is subsequent to said second transistor ($T_{2n+2}$), to which said first output is coupled after a corresponding time delay.

5. A bucket brigade circuit according to claim 4 wherein said subsequent transistor ($T_{2n+3}$) immediately follows said second transistor ($T_{2n+2}$), said corresponding delay amounting to one-half the period of said first and second clock signals.

6. A bucket brigade circuit according to claim 5 wherein the A.C. component of said first output is stored in a first storage capacitor $C_s$ during said one-half the period of said clock signals.

7. A bucket brigade circuit according to claim 6 further comprising:
a third transistor ($T_a$);
a fourth transistor ($T'_c$);
a second differential amplifier (DV2) having first and second inputs and third and fourth outputs;
a fifth transistor ($T_b$);
a sixth transistor ($T_d$); and
a first coupling capacitor ($C_K$), wherein said first output is coupled to said third output via the series arrangement consisting of the source-drain path of said third transistor, said first storage transistor, and the source-drain path of said fourth transistor; wherein said first and second inputs are coupled to said third output; and wherein said first storage capacitor is bridged by the source-drain path of said fifth transistor, the connecting point between said first storage capacitor and the source of said fourth transistor coupled to the drain of said subsequent transistor ($T_{2n+3}$) via the series arrangement consisting of the source-drain path of said sixth additional transistor and said first coupling capacitor; and wherein the gate electrodes of said third and fourth transistors are controlled by said second clock signal and the gate electrodes of said fifth and sixth transistors are controlled by said first clock signal.

8. A bucket brigade circuit according to claim 4 wherein said first output is inverted with respect to the drain potential difference between said first and second transistors.

9. A bucket brigade circuit according to claim 8 wherein said A.C. component is further delayed in a second bucket brigade circuit by one complete period of the clock signals.

10. A bucket brigade circuit according to claim 9 further comprising:
   a three-stage bucket brigade circuit;
   a seventh transistor;
   a second coupling capacitor;
   a two-stage bucket brigade circuit; and
   an eighth transistor wherein said connecting point is coupled to the input of said three-stage bucket brigade circuit, and the output of said three-stage bucket brigade circuit is coupled to the drain of said subsequent transistor via the series arrangement consisting of the source-drain path of said seventh transistor and of said second coupling capacitor; and wherein the output of said two-stage bucket brigade circuit is coupled to the connecting point between the seventh additional transistor and second coupling capacitor via an source-drain path of said eighth additional transistor; and wherein the gate electrodes of said third, fourth and eighth additional transistors are controlled by said second clock signal and the gate electrodes of said fifth, sixth and seventh transistors are controlled by said first clock signal.

11. A bucket brigade circuit according to claim 1 wherein said first output of said first differential amplifier is coupled to the drain electrode of said second transistor without time delay.

12. A bucket brigade circuit according to claim 1 further comprising:
   a fourth bucket brigade circuit of identical design and dimensions wherein the compensation of the signal attenuation is automatically adjusted at half the clock signal frequency in that the gain factor of said differential amplifier is varied in dependence upon the compensation of the signal attenuation as produced in said fourth bucket brigade circuit.

13. A bucket brigade circuit according to claim 12 further comprising:
   a single stage binary divider, wherein the attenuation of said fourth bucket brigade circuit is compensated after the same number of stages as in said first bucket brigade circuit and wherein the potential difference between the attenuation compensation signal of said fourth bucket brigade circuit and the unattenuated signal of said fourth bucket brigade circuit is used for generating a regulating potential.

14. A bucket brigade circuit according to claim 13 wherein said current pulse is generated by a source of constant current controlled by the output of said first differential amplifier.

15. A bucket brigade circuit according to claim 14 wherein said current pulse is proportional to a noninverted output of said first differential amplifier with respect to the collector potential difference between said first and second transistors and wherein said current pulse is fed to the drain of the transistor immediately subsequent to said second transistor, said current pulse being delayed for a period corresponding to one one-half period of said clock signals.

16. A bucket brigade circuit according to claim 15 further comprising:
   a fifth additional bucket brigade circuit;
   an impedance converter stage; and
   a ninth transistor, wherein the output of said first differential amplifier is connected to the input of said fifth additional bucket brigade circuit and wherein the output of said fifth additional bucket brigade circuit is coupled to the input of said constant current pulse via said impedance converter stage, the output of said constant current source coupled to the drain terminal of the transistor immediately subsequent said second transistor via the source-drain path of said ninth transistor, the gate terminal of said ninth transistor controlled by said first clock signal.

17. A bucket brigade circuit according to claim 16 wherein said current pulse equals "0" when the two input signals of said first differential amplifier are equal.

18. A bucket brigade circuit according to claim 17 wherein in addition to said current pulse, a constant additional current pulse generated by an additional constant current source is fed to the drain terminal of the transistor immediately subsequent said second transistor, said additional current pulse adjustable such that when the input signals of said first differential amplifier are equal, the total current pulse will be "0."

19. A bucket brigade circuit according to claim 18 wherein said constant current source is a tenth transistor having a conductivity complementary to the remaining transistors, and wherein said additional constant current source consists of an eleventh transistor having the same conductivity of the remaining transistors and controlled by said first clock signal.

20. A bucket brigade circuit according to claim 19 wherein the transistors are integrated insulated-gate field-effect transistors of the enhancement type.

21. A bucket brigade circuit according to claim 19 wherein the transistors are integrated insulated-gate field-effect transistors of the depletion type.

22. A bucket brigade circuit according to claim 19 wherein all capacitors are integrated capacitances.

23. A bucket brigade circuit according to claim 16 further including a twelfth transistor having a conductivity complementary to said eleventh transistor, said twelfth transistor having an source drain path arranged in parallel with said eleventh transistor.

* * * * *